United States Patent [19]
Okita

[11] Patent Number: 5,651,032
[45] Date of Patent: Jul. 22, 1997

[54] APPARATUS AND METHOD FOR TRELLIS DECODER

[75] Inventor: Shigeru Okita, Kanagawa-ken, Japan

[73] Assignee: Kabushiki Kaisha Toshiba, Kawasaki, Japan

[21] Appl. No.: 334,349

[22] Filed: Nov. 2, 1994

[30] Foreign Application Priority Data

Nov. 4, 1993 [JP] Japan .................................. 5-275599
Nov. 4, 1993 [JP] Japan .................................. 5-275660

[51] Int. Cl.$^6$ .................................................. H04L 1/00
[52] U.S. Cl. ........................... 375/341; 375/265; 371/43
[58] Field of Search ................................. 375/262, 265, 375/341, 340; 371/43

[56] References Cited

U.S. PATENT DOCUMENTS 5,257,272  10/1993  Fredrickson ........................ 371/43
5,425,037   6/1995  Uesuji et al. ...................... 371/43
5,469,452  11/1995  Zehavi ............................... 371/43

FOREIGN PATENT DOCUMENTS

93/06550  4/1993  WIPO .

OTHER PUBLICATIONS

G. Feygin et al., "A Multiprocessor Architecture for Viterbi Decoders with Linear Speedup", *IEEE Transactions on Signal Processing* 41(9): 2907–2917 (1993).

Ungerboeck, "Trellis–Coded Modulation With Redundant Signal Sets Part I: Introduction", *IEEE Communications Magazine*, vol. 25, No. 2, pp. 5–11, (1987).

Viterbi et al., "A Pragmatic Approach To Trellis–Coded Modulation", *IEEE Communications Magazine*, pp. 11–19, (1989).

Pottie et al., "Multilevel Codes Based on Partitioning", *IEEE Transactions On Information Theory*, vol. 35, No. 1, pp. 87–98, (1989).

*Primary Examiner*—Stephen Chin
*Assistant Examiner*—Kevin Kim
*Attorney, Agent, or Firm*—Foley & Lardner

[57] ABSTRACT

A digital data processing apparatus capable of reducing a circuit scale without deteriorating error-correcting capability, and capable of reducing the bit number of a branch metric calculating circuit. The apparatus includes: a region determining portion which determines an optimal bit number corresponding to the number of representative symbol groups; a delaying portion which delays an output from the region determining portion for as long as a coded bit is decoded by a Viterbi decoding portion; and a decoding portion which inputs and decodes an output from the delaying portion and a coded bit that is decoded by the Viterbi decoding portion so as to be decoded, and which outputs the uncoded bit.

19 Claims, 19 Drawing Sheets

FIG. 2A
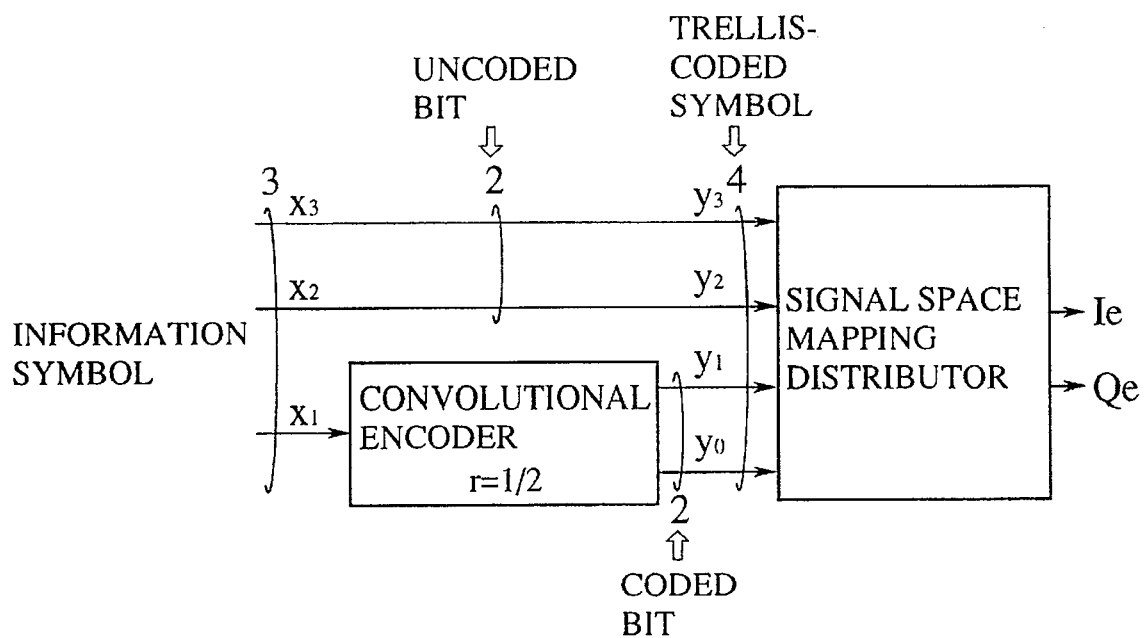
FIG. 2B
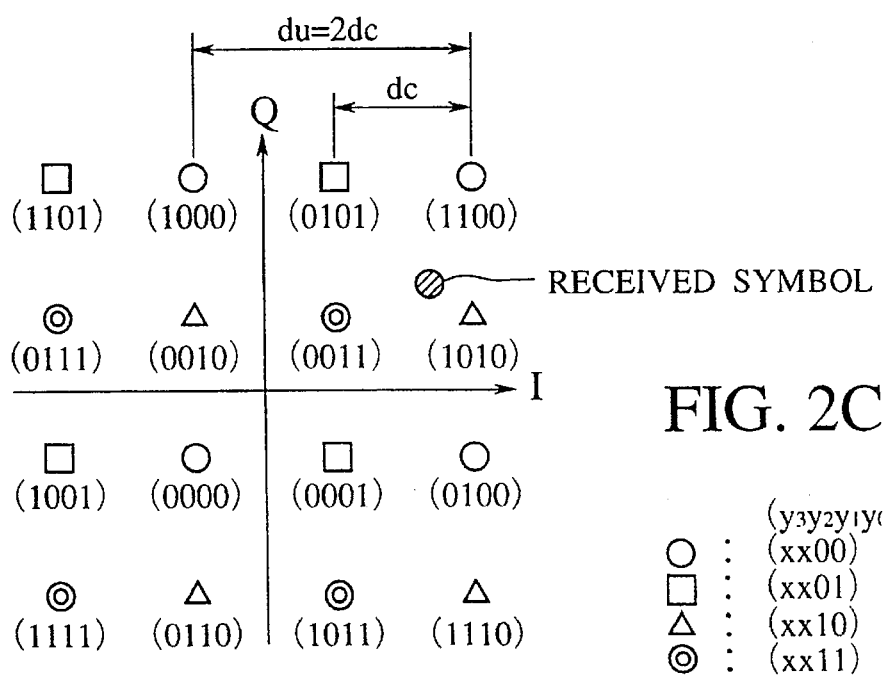
FIG. 2C

FIG. 9

| SYMBOL POSITION (OTHER CH) || REGION DETERMINING MEANS (OTHER CH) ||
| (DECIMAL) | MSB (BINARY) LSB | INPUT (UPPER3BIT) | OUTPUT (2BIT) |
|---|---|---|---|
| 15<br>14<br>13<br>12 | 011 11<br>011 10<br>011 01<br>011 00 | 011 | 10 |
| 11<br>10<br>9<br>8 | 010 11<br>010 10<br>010 01<br>010 00 | 010 | |
| 7<br>6<br>5<br>4 | 001 11<br>001 10<br>001 01<br>001 00 | 001 | |
| 3<br>2<br>1<br>0 | 000 11<br>000 10<br>000 01<br>000 00 | 000 | 01 |
| -1<br>-2<br>-3<br>-4 | 111 11<br>111 10<br>111 01<br>111 00 | 111 | |
| -5<br>-6<br>-7<br>-8 | 110 11<br>110 10<br>110 01<br>110 00 | 110 | |
| -9<br>-10<br>-11<br>-12 | 101 11<br>101 10<br>101 01<br>101 00 | 101 | 00 |
| -13<br>-14<br>-15<br>-16 | 100 11<br>100 10<br>100 01<br>100 00 | 100 | |

FIG. 11

| SYMBOL POSITION (OTHER CH) | | REGION DETERMINING MEANS (OTHER CH) | |
|---|---|---|---|
| (DECIMAL) | MSB (BINARY) LSB | INPUT (UPPER3BIT) | OUTPUT (2BIT) |
| 12 | 011 00 | 011 | 10 |
| 11<br>10<br>9<br>8 | 010 11<br>010 10<br>010 01<br>010 00 | 010 | |
| 7<br>6<br>5<br>4 | 001 11<br>001 10<br>001 01<br>001 00 | 001 | |
| 3<br>2<br>1<br>0 | 000 11<br>000 10<br>000 01<br>000 00 | 000 | 01 |
| -1<br>-2<br>-3<br>-4 | 111 11<br>111 10<br>111 01<br>111 00 | 111 | |
| -5<br>-6<br>-7<br>-8 | 110 11<br>110 10<br>110 01<br>110 00 | 110 | 00 |
| -9<br>-10<br>-11<br>-12 | 101 11<br>101 10<br>101 01<br>101 00 | 101 | |

FIG. 16

NONLINEAR PROCESSING
8BIT FULL→7BIT

128→(127)

```
64 ●                                              e
                                              113 ● 128→  ○ 113
49 ○   ○   ○   ○   ○   ○   ○   ○96°   ○    ○    ○    ○     ○ 69
36 ○   ○   ○   ○   ○   ○72°  ○     ○    ○    ○    ○     ○ 65
25 ○   ○   ○   ○   ○50°  ○c   ○    ○    ○    ○    ○d   ○ 64
16 ○   ○   ○   ○32°  ○    ○    ○    ○    ○    ○    ○
 9 ○   ○   ○18°  ○    ○    ○    ○    ○    ○  16  25  36  49
 4 ○   ○ 8°  ○    ○    ○    ○    ○    ○     9
 1 ○ 2°  ○    ○    ○    ○    ○    ○    ○     4
   ●    0   1    2                                        
STARTING
POINT
```

As : An integer not smaller than $\log_2 J$

FIG. 18

| | | | | | | | | |
|---|---|---|---|---|---|---|---|---|
| 4 | 4 | 4 | 4 | 5 | 5 | 6 | 7 | 7 |
| 3 | 3 | 3 | 3 | 4 | 4 | 5 | 6 | 7 |
| 2 | 2 | 2 | 2 | 3 | 3 | 4 | 5 | 6 |
| 1 | 1 | 1 | 2 | 2 | 3 | 3 | 4 | 5 |
| 1 | 1 | 1 | 1 | 2 | 2 | 3 | 4 | 5 |
| 0 | 0 | 0 | 1 | 1 | 2 | 2 | 3 | 4 |
| 0 | 0 | 0 | 0 | 1 | 1 | 2 | 3 | 4 |
| 0 | 0 | 0 | 0 | 1 | 1 | 2 | 3 | 4 |
| 0 | 0 | 0 | 0 | 1 | 1 | 2 | 3 | 4 |

FIG. 19

| | | | | | | | | |
|---|---|---|---|---|---|---|---|---|
| 4 | 4 | 4 | 4 | 5 | 5 | 6 | 7 | 8 |
| 3 | 3 | 3 | 3 | 4 | 4 | 5 | 6 | 7 |
| 2 | 2 | 2 | 2 | 3 | 3 | 4 | 5 | 6 |
| 1 | 1 | 1 | 2 | 2 | 3 | 3 | 4 | 5 |
| 1 | 1 | 1 | 1 | 2 | 2 | 3 | 4 | 5 |
| 0 | 0 | 0 | 1 | 1 | 2 | 2 | 3 | 4 |
| 0 | 0 | 0 | 0 | 1 | 1 | 2 | 3 | 4 |
| 0 | 0 | 0 | 0 | 1 | 1 | 2 | 3 | 4 |
| 0 | 0 | 0 | 0 | 1 | 1 | 2 | 3 | 4 |

APPARATUS AND METHOD FOR TRELLIS DECODER

BACKGROUND OF THE INVENTION

1. Technical Field

The present invention relates to an uncoded bit decoding circuit and a branch metric processing circuit in a trellis decoding circuit which decodes trellis-coded modulated information symbols.

2. Background Art

A coded modulation technique is to improve transmission characteristics by optimally signal-arranging coded bit(s) and uncoded bit(s).

In the coded bits, the inter-signal distance can be easily provided by error correcting coding such as a block coding and convolutional coding. Therefore, among symbols which are located comparatively in close distance on constellation, the coded bits therefor may differ from other. On the other hand, as for the uncoded bits, they do not contain any effect intrinsic to the coding, so that the distance therebetween is determined on the constellation alone.

A basic function of signal arrangement in the coded modulation scheme is to maximize the distance for symbols (subset symbols) whose coding bit are the same. In other words, by maximizing the distance, the distance between the codes can also be expanded in an equivalent manner, so that a transmission mode whose transmission characteristic is preferable can be realized.

In the above-described coded modulation mode, presupposed is a multiple-valuedness of the modulation. On the other hand, in order to prevent a transmission band from expanding due to the coding operation, a modulation level need be increased, so that the transmission characteristic for the uncoded may be deteriorated. However, the improvement degree achieved by the above-described coding offsets and outweighs the deterioration of the transmission characteristic, thus generating a coding gain. Therefore, in the coded modulation mode, the coding gain can be comparatively easily obtained under band-limited channels, even in a case of utilizing the multiple-value modulation.

When a convolutional coding is used for the coding, it is generally called a trellis-coded modulation or TCM.

FIG. 21 shows a general construction for a trellis encoder. Referring to FIG. 21, information symbols (k+m) is divided to uncoded bits (k bits) and m bits which are fed to a convolutional coding unit 101, and the thus fed m bits are expanded to coded bits n, so that modulation symbols (k+n) are modulated and output therefrom.

The feature of trellis coded modulation proposed by G. Ungerboeck lies in that, referring to FIG. 1, how effectively the coded and uncoded bits are allocated to modulation symbols. The publication concerning G. Ungerboeck is, for example, available as "Channel coding with Multilevel/Phase Signals", IEEE Trans. Inform. Theory, Vol. IT-28, pp. 55–67, January 1982. The allocation originates in a "set-partitioning" technique. For example, the convolutional coding is utilized as a coding scheme in TCM, and configuration is determined such that the distance between the codes including the above-mentioned allocation, that is an Euclidean distance, is maximum. This is also known as "Ungerboeck code".

In "A pragmatic Approach to Trellis-Coded Modulation" (written by A. J. Viterbi, J. K. Wolf, E. Zehavi and R. Padovani, IEEE Communications Magazine, Vol. 27, pp. 11–19, July 1989), a coding scheme is designed so that, utilizing binary codes, an inter-code distance (Hamming distance) is maximum, and the convolutional codes are utilized for these TCM codes. This scheme is called "Pragmatic Code" because of its nature being practical.

FIG. 1 shows a general configuration of coding of TCM.

Referring to FIG. 1, input information symbol $m_0$ bits all expanded to coded symbol $n_0$ bits so as to be allocated to the modulation symbol. Then, coding rate R as a whole is such that $R=m_0/n_0$. Moreover, as for code expansion, there is utilized the convolutional coding with coding rate $r=m/n$, where coding rate of the convolutional coding is r. Therefore, an uncoded bit which is not coded is expressed by $(m_0-m)=(n_0-n)$ bits. Among information symbols, a Viterbi algorithm is used for m bits.

A basic rule for a signal space mapping in TCM is that the coded bits are commonly shared, and that in the uncoded bits alone the Euclidean distance du (see FIG. 2C) between different modulation symbols is set to as much as possibly (or is set to a maximum distance). Here, a set of modulation symbols where the coded bits are commonly shared is called a subset.

For example, suppose that a very powerful convolutional code in the course of coding operation is utilized and a coding error rate of the coded bits become "0" in a range beyond a certain C/N (Carrier-to-Noise ratio). Then, the transmission error characteristic is determined only by the Euclidean distance du, so that an optimum signal space mapping can be obtained. Thus, in order to effect such a space mapping, the coded symbols are converted and modulated to a space mapping data Ie/Qe corresponding to respective I/Q axes by a signal space mapping distributor.

FIGS. 2A–2C show construction for a coding of the "Pragmatic Code" and an example of the signal space mapping therefor. Though as the modulation mode there is utilized a Phase Shift Keying (PSK) in a literature by A. J. Viterbi, FIGS. 2A–2C show a case applying to 16-point Quadrature Amplitude Modulation (QAM) (hereinafter referred to as 16 QAM-TCM or simply 16 TCM). In this case, the convolutional coding is performed utilizing the coding rate $r=\frac{1}{2}$. The coding rate as a whole is ¾. Thus, 3 bit information can be transmitted as per single modulation symbol. Moreover, the bit number of the uncoded bits is 2 bits, and each subset is comprised of 4 modulation symbols. As for the case applied to 16 QAM, you may refer to G. J. Pottie, D. P. Taylor, "Multilevel Codes Based on Partitioning, Appendix I", IEEE Trans. on Inform. Theory, Vol. 35, No. 1, pp. 96–97, January 1989.

In general, there are $2^n$ subsets for bit number n of the coded bits, and the number of the modulation symbols constituting each subset is $2^{(n_0-n)}$ against the bit number $(n_0-n)$ of the uncoded bits, where ^ indicates to a power of 2. Similarly, the modulation symbols which constitute each subset are configured such that the distance between the modulation symbols is maximum. In the case shown in FIG. 2B, the Euclidean distance du equals to 2×dc (du=2dc), and an improvement degree of the error rate against the uncoded 16 QAM is approximately 6 dB. Therefore, the coding gain is defined by the improvement degree over the uncoded 8 PSK of 3 bit per symbol, thus being approximately 4 dB.

Next, a decoding technique is described below in the case of 16 TCM with reference to FIG. 3.

FIG. 3 is a block diagram showing construction of a decoder. Referring to FIG. 3, the space mapping data Id/Qd corresponding to the arrangement on the I/Q axes of demodulated received symbols are input, and trellis decoded symbols ($x_3$, $x_2$, $x_1$) are output. As shown in FIGS. 2A–2C, the received symbols are soft-decision decoded in determining the space mapping in each axis, and q=5 for example. On the contrary, q=3 is sufficient in a hard decision of 16QAM. Thus, difference thereof is 2 bits, and the total of 4 bit together with I/Q are soft-decision decoded.

Based on information obtained from the soft decision, four branch metrics to be used for the Viterbi decoding are calculated by a signal space mapping decoding means such as a branch metric unit (referred to as BMU hereinafter). Through the calculation, information bit ($x_1$) is obtained from a Viterbi decoder. It is to be noted that though the Viterbi decoder usually contains the branch metric unit (BMU), the BMU is depicted as a separate unit from the Viterbi decoder as shown in FIG. 3.

Next, a principle of trellis decoding will be described hereinbelow with reference to FIGS. 4A–4D.

First, the hard decision is performed on each subset and a candidate for decoding symbol, that is, a representative or typical symbol is detected. In other words, since, among trellis coded symbols ($y_3y_2y_1y_0$), lower two bits can not be determined until Viterbi-decoded, ($xxy_1y_0$) is detected in advance as for ($y_1y_0$)=(00)–(11).

For example, referring to FIG. 4A, symbol of (1100) becomes the representative symbol for subset symbol which is blank-circled, against the received symbol that is a blackened circle. Similarly, referring to FIGS. 4B–4D, (0101), (1010) and (0011) become the representative symbol, respectively, for each subset. Now, the upper two bits suffice in the detection of the representative symbol, whereas the lower two bits can be determined after the Viterbi decoding process. Thus, the output bit number of the representative symbol will be 2×4=8 bits.

The branch metric required for the Viterbi decoding is determined based on the Euclidean distance between each representative symbol and received symbol. Now, branch metrics $\lambda_0$, $\lambda_1$, $\lambda_2$, $\lambda_3$ corresponding to ($y_1 y_0$)=(00)–(11) are respectively expressed by Bs bits. For example, Bs may be 4 or 3 (Bs=4 or Bs=3). Utilizing these branch metrics, the error corresponding to possible transmission sequence (path), whose number is Ns, determined by the configuration of the convolutional coding is accumulated and made a path metric. Thereafter, in accordance with the path metric, a path is selected and is stored in a Ms-stage path memory. Among Ns path stored thus, the most probable and likely bit which is stored earliest is output as a Viterbi decoded bit.

As described above, the information bit ($x_1$) is regenerated while being error-corrected, and after it is convolutional-coded, there is regenerated the coded bit ($y_1$ $y_0$). The path memory stages Ms are usually four to six times a constraint length; for example, when the number of states Ns=64, Ms=30 through 40.

The coded bit ($y_1$ $y_0$) which is decoded by a circuit shown in FIG. 3, includes error-correcting effect, and by utilizing such effect, uncoded bits ($y_3$ $y_2$)=($x_3$ $x_2$) are decoded. Since each detected representative symbol is delayed by as much as the time consumed for being Viterbi-decoded, the symbol is input to a Ms-stage shift register. Thereafter, the bits ($y_3$ $y_2$) corresponding to the bits ($y_1$ $y_0$) which are thus decoded and regenerated, are selected and the upper two bits of the trellis decoded symbol are determined.

For example, referring to FIGS. 4A–4D, when the outputs of the Ms-stage shift register are (11), (01), (10) and (00), ($y_3$ $y_2$)=($x_3$ $x_2$)=(11) if ($y_1$ $y_0$)=(00). Therefore, the modulation symbol corresponded in FIG. 4 will be (1100). In other words, even though the modulation symbol turns out to be (1010) by a hard decision of 16 QAM shown in FIG. 4 or FIG. 2, the error is corrected in a manner that In accordance with received sequence about the lower two bits, (1100) is determined correct after all.

Next, drawbacks in the conventional art will be explicitly described hereinbelow. FIG. 5 illustrates a typical uncoded-bit decoding system according to the conventional practice.

In the example shown in FIG. 2B, there are nine ways of possible grouping of representative symbols (J=9). Although it is primarily possible to express by 4 bits (3<$\log_2 J$<4), the output of a representative symbol detecting portion 113 (FIG. 5) is 8 bit and redundant. Particularly, when the representative symbol detecting portion 113 is realized by a ROM (read only memory), a scale of the ROM will be $2^{10} \times 8 \approx 8$ k bit=16 k transistors; referring to FIG. 5, when T=32 in a T-stage shift register 115 and there are required 22 transistors per single bit, the scale of T-stage shift register will result in 8×32×22=5632 transistors.

Now, the branch metric is calculated in the course of performing the Viterbi decoding. In the trellis decoding scheme, a square of the Euclidean distance between received symbol and the representative symbol of each subset is used. When this value of the Euclidean distance is directly taken as the branch metric, each branch metric is, for example, expressed by 8 bits. On the other hand, in order to reduce the scale of a branch metric calculating circuit, the bits are often truncated. In other words, when the branch metric unit is constituted by the ROM in the conventional practice, the ROM having $2^{10} \times 4 \times 4 = 8192$ bits will be necessary if the received symbol which is soft decision made is expressed by 10 bits and the bit truncation is applied to the upper 4 bits. When the ROM having this much scale is built in a trellis decoding LSI (large-scale integration circuit) so as to be a single chip, there is caused inefficiency in its cost performance.

SUMMARY OF THE INVENTION

In view of the foregoing drawbacks, it is therefore an object of the present invention to provide an uncoded bit decoding apparatus capable of reducing a circuit scale without deteriorating error-correcting capability.

Another object of the present invention is to provide a branch metric calculating circuit capable of reducing the bit number of the branch metric and reducing also the circuit scale therefor.

According to one aspect of the present invention, there is provided a digital processing apparatus comprising: region determining means for inputting a received symbol so as to generate an uncoded bit and producing regional information corresponded to a group of symbols specified by the received symbol; delaying means for delaying the regional information output from the region determining means for as long as the received symbol is maximum-likelihood-decoded by a maximum-likelihood decoding means; and decoding means for inputting output from the delaying means and a coded bit that is decoded by the maximum-likelihood decoding means so as to be decoded, and for outputting the uncoded bit.

According to another aspect of the present invention there is provided a branch metric processing apparatus comprising: limiter means for performing an amplitude limitation on a received symbol obtained by soft-decision; and distance calculating means for producing a branch metric in a Viterbi decoding, by calculating square of Euclidean distance on data obtained from the limiter means.

One advantage of the present invention is that it provides for a trellis decoding circuit having a minimal circuit scale therefor without sacrificing the error correcting capability.

Another advantage of the present invention is that the bit number of the branch metrics is reduced and the circuit scale therefor is minimized.

BRIEF DESCRIPTION OF THE DRAWINGS

These and other objects, features and advantages of the present invention will become more apparent from the following description of the preferred embodiment taken in conjunction with the accompanying drawings, in which:

FIGS. 2A-2C show construction for a coding of the "Pragmatic Code" and an example of the signal space mapping therefor.

FIG. 9 shows input/output relation of the region determining means shown in FIG. 8.

FIG. 11 shows relation of input and output of the region determining means for each channel.

FIG. 16 illustrates an example showing the square of the Euclidean distance with the representative symbol situated in lower left position marked with STARTING POINT in the nine-value soft decision.

FIG. 18 illustrates a case where the nonlinear processing is performed.

FIG. 19 illustrate a case where the nonlinear processing is not performed.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Figure 6:
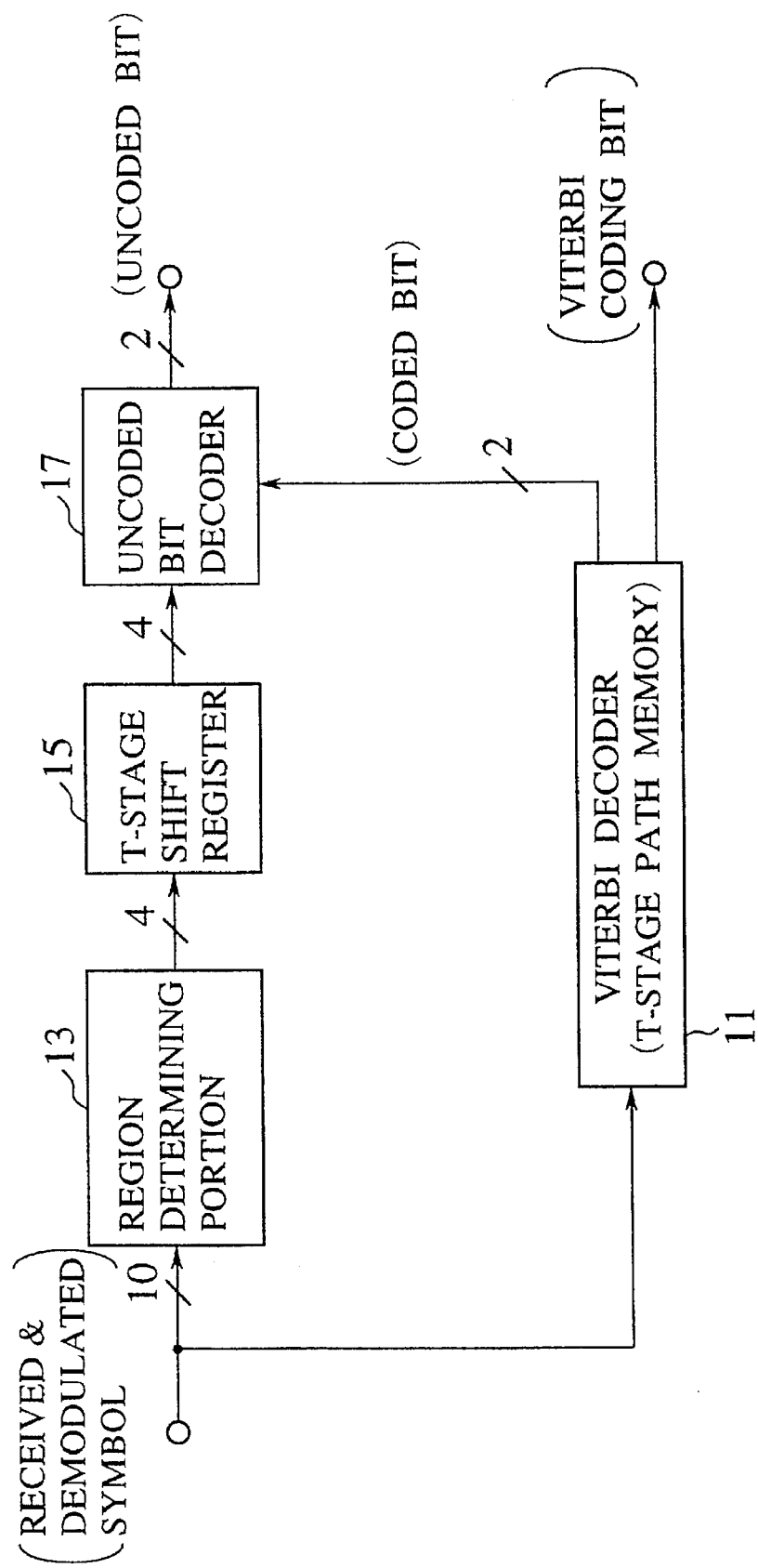
FIG. 6 is a block diagram showing configuration of an uncoded bit decoding circuit according to the present invention.

FIG. 6 is a block diagram showing configuration of an uncoded bit decoding circuit according to the present invention.

Figure 21:
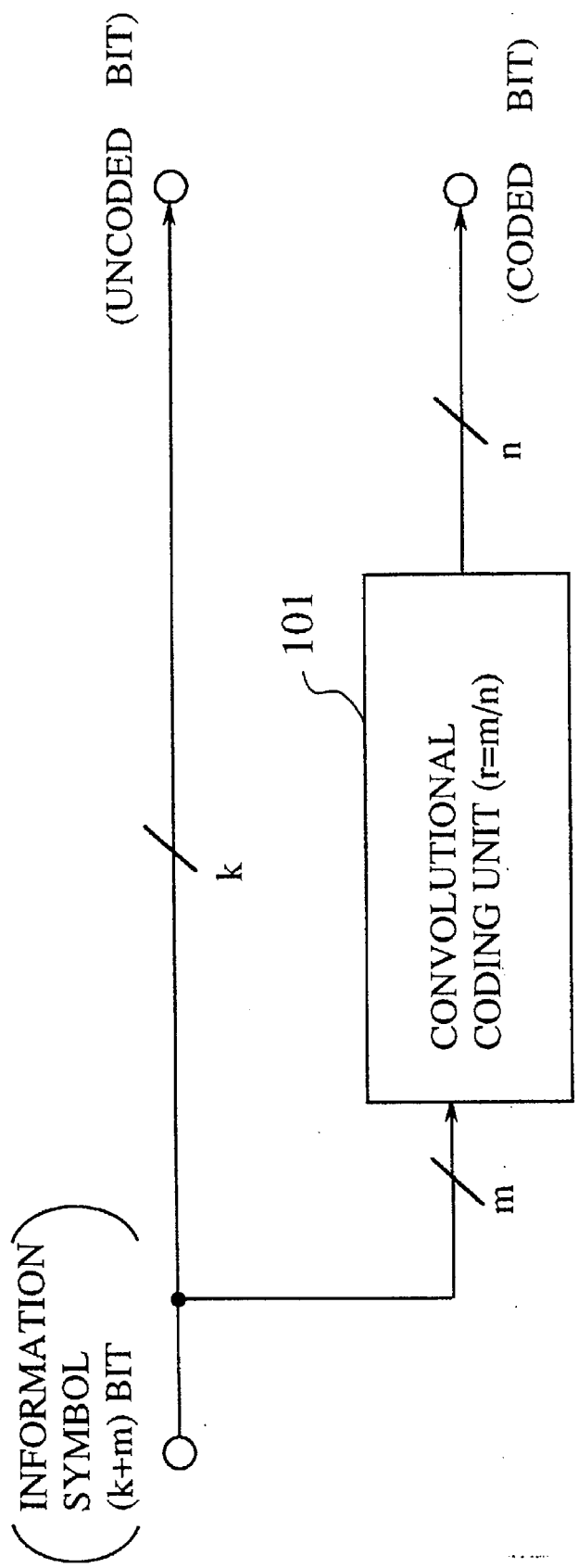
FIG. 21 shows a general construction for a trellis encoder.

Referring to FIG. 6, a received symbol is input to a region determining portion 13 and a Viterbi decoder 11. An uncoded bit decoder 17 is connected, in series, to the region determining portion 13 by way of a T-stage shift register 15. A coded bit output from the Viterbi decoder 11 is input to the uncoded bit decoder 17. Thereby, there is obtained a Viterbi decoded bit from the Viterbi decoder 11, whereas there is obtained an uncoded bit from the uncoded bit decoder 17. In the case shown in FIG. 6, k=2, m=1 and n=2. (Referring to FIG. 21, information symbols (k+m) is divided to uncoded bits (k bits) and m bits which are fed to a convolutional coding unit 101, and the thus fed m bits are expanded to coded bit n, so that modulation symbols (k+n) are modulated and output therefrom.)

A Viterbi decoding is an algorithm which realizes a maximum-likelihood decoding in an efficient manner.

Figure 1B:
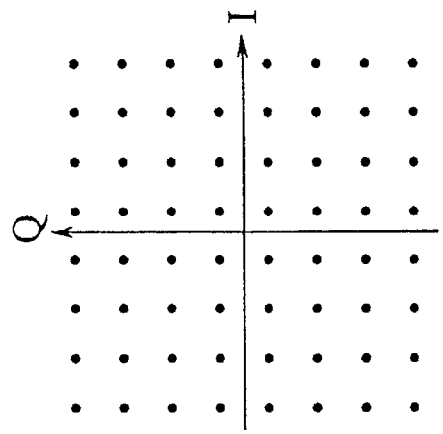
FIGS. 1A and 1B shows a general configuration of coding of TCM.
Figure 1A:
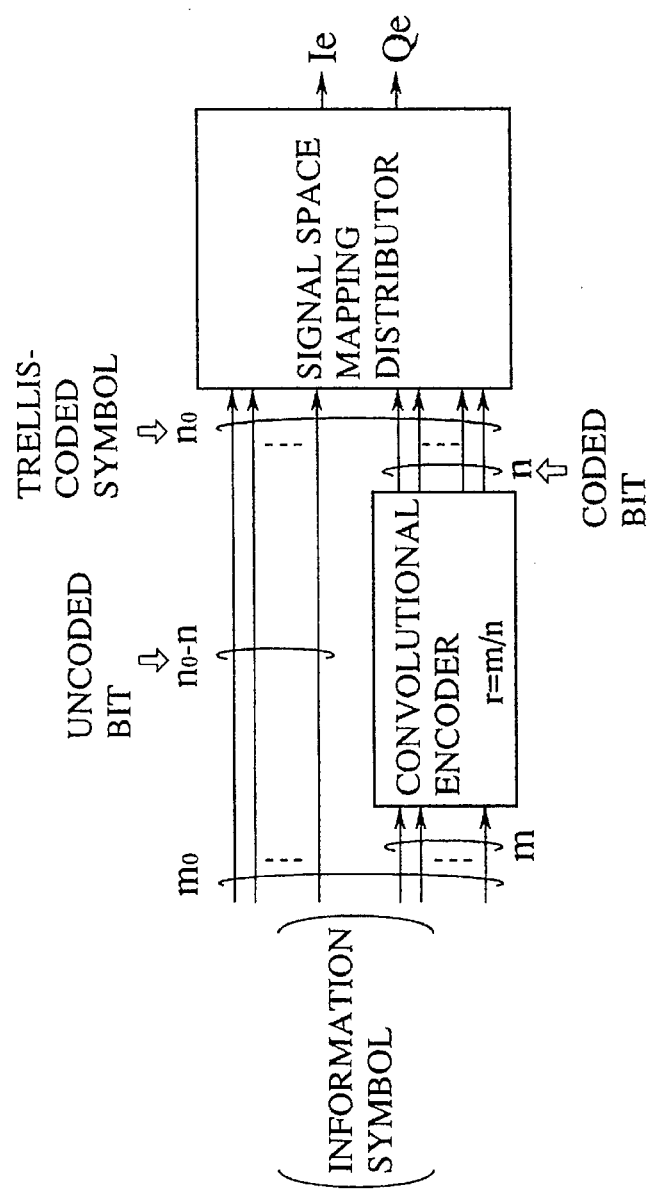
Figure 3:
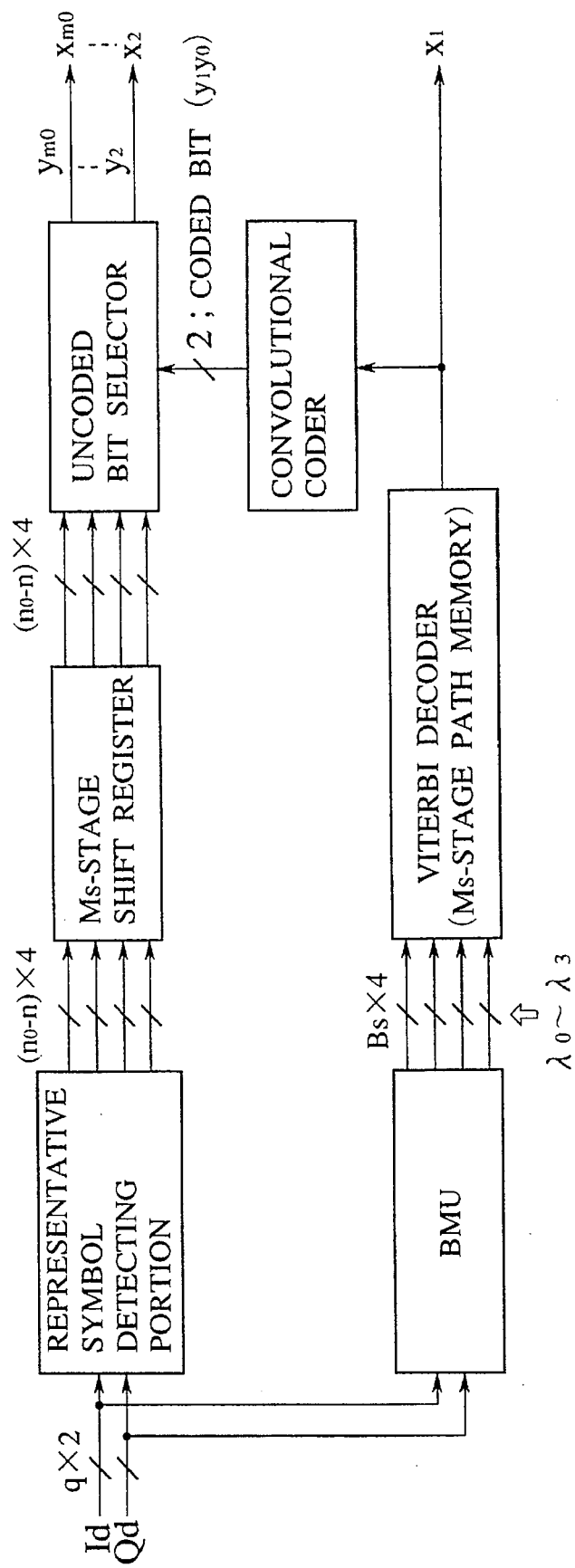
FIG. 3 is a block diagram showing construction of a decoder.
Figure 4A:
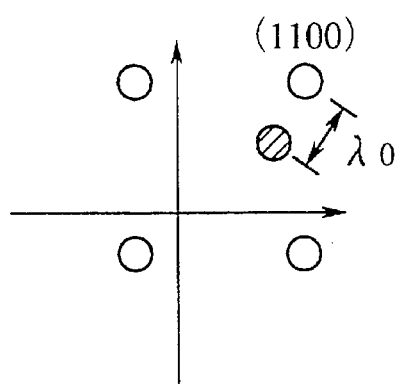
FIGS. 4A-4D illustrate a principle of trellis decoding.
Figure 4B:
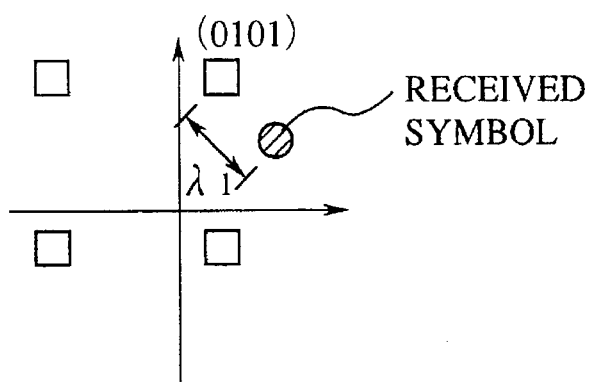
Figure 4C:
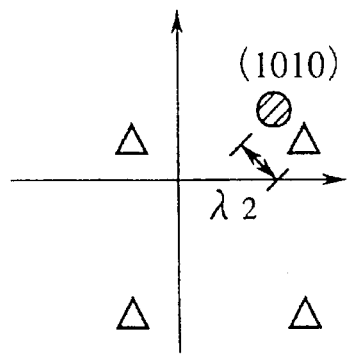
Figure 4D:
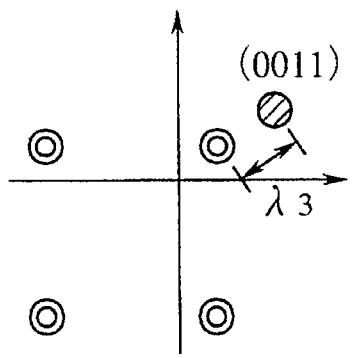
Figure 17:
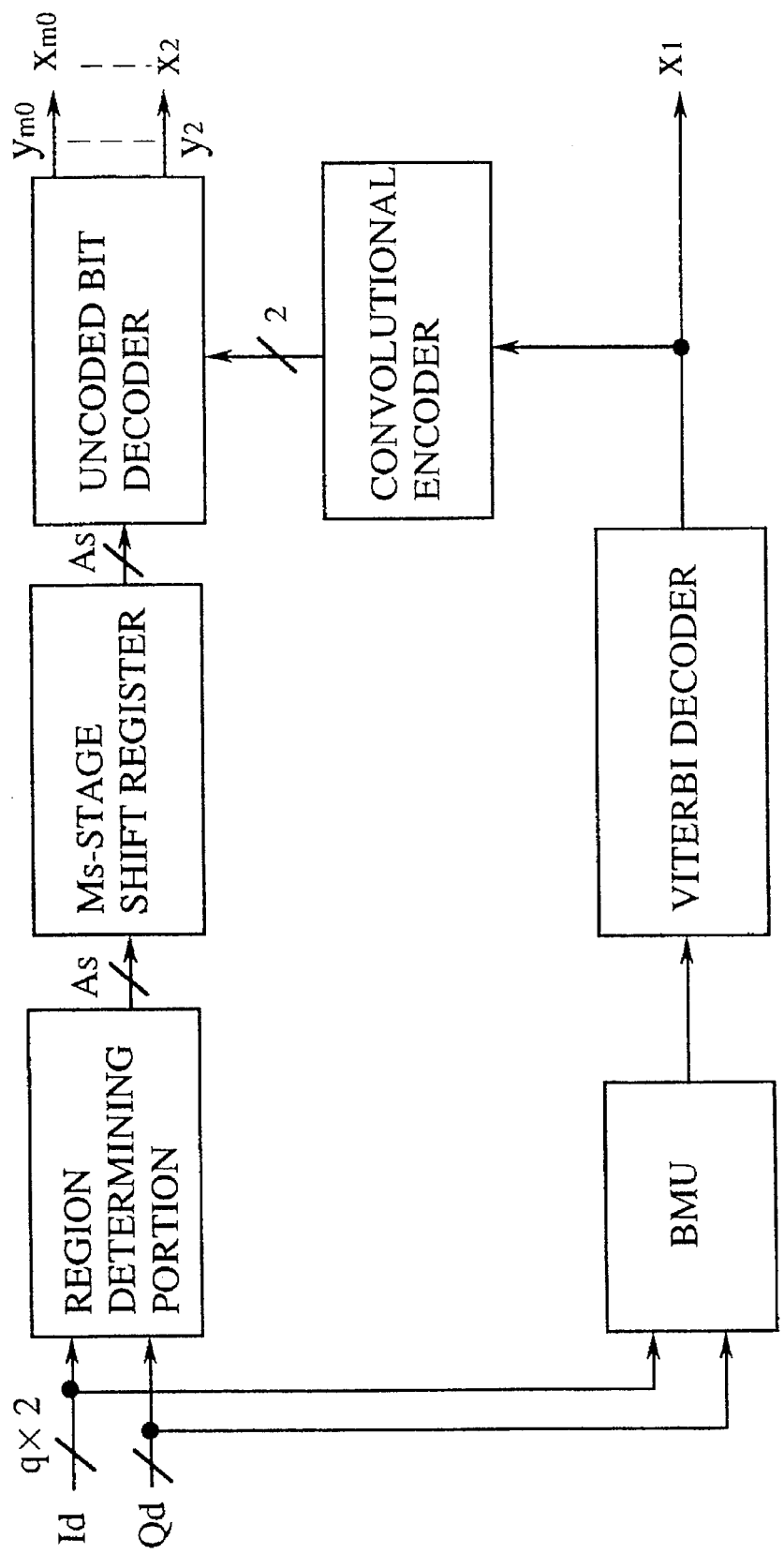
FIG. 17 is a block diagram showing configuration of an uncoded bit decoding circuit according to the present invention, in comparison to the conventional one shown in FIG. 3

Referring to FIG. 17, there is shown another block diagram showing configuration of the uncoded bit decoding circuit with As=4 according to the present invention in comparison to the conventional one shown in FIG. 3.

Figure 12:
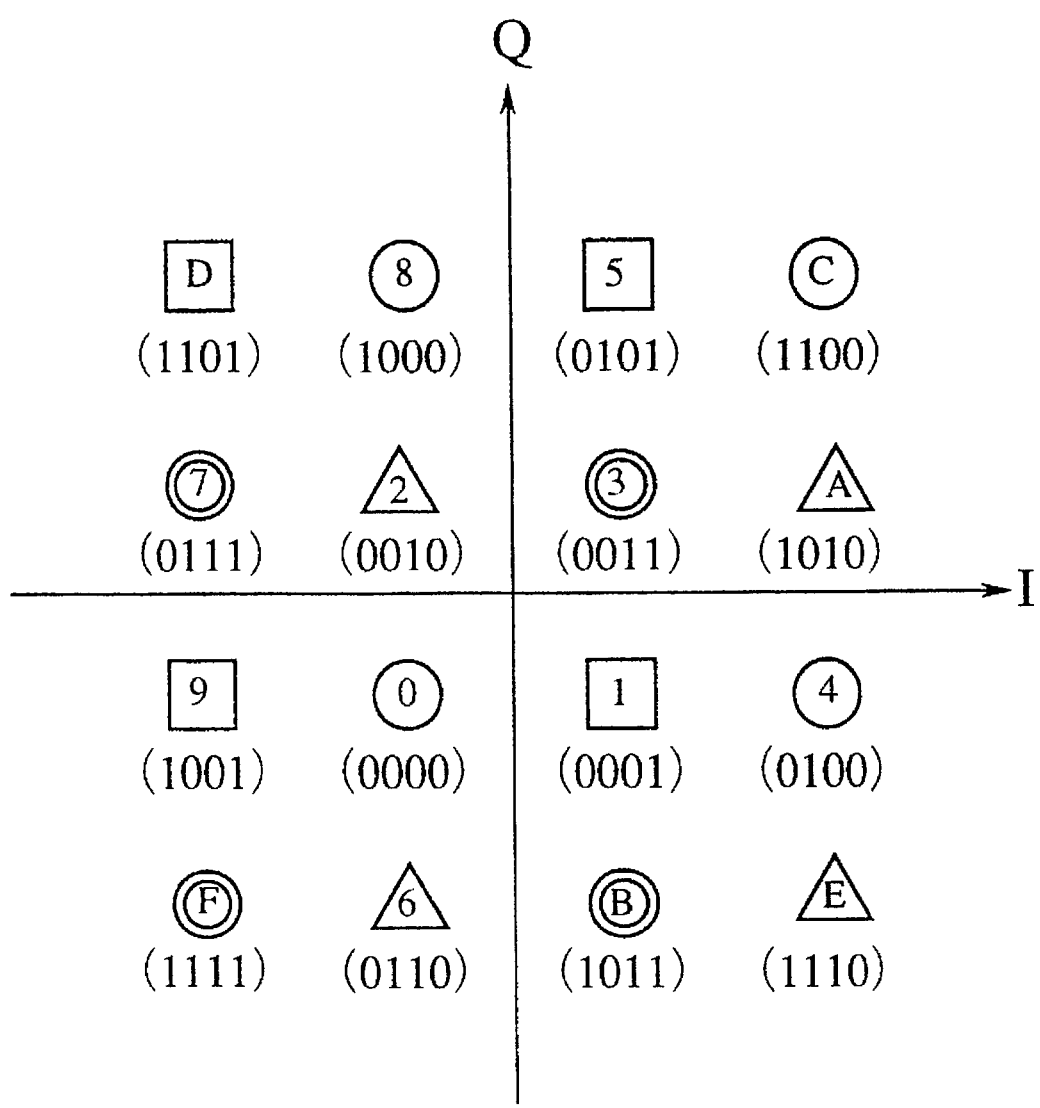
FIG. 12 shows an example of the signal space mapping (in a case of uncoded bit being two) where the uncoded bit number is greater than the 2 bits.

FIG. 12 shows an example of the signal space mapping (in the case of uncoded bits being two).

The arrangement of the uncoded 2 bits (or upper two bits) in a group of symbols set at a predetermined bit configuration, that is, in each subset symbol of the subset, is given the mapping by a Gray code. Specifically, paying attention to the circled symbols whose lower two bits are "00", adjacent circled symbols (circled 0=(0000)$_2$ and circled 4=(0100)$_2$, circled 0=(0000)$_2$ and circled 8=(1000)$_2$ are made to differ by 1 bit only from one other.

Next, among representative symbols of each subset, adjacent symbols are made to differ by 1 bit about lower two bit of the coded bits, from one other. Specifically, for example, as for square-inscribed 5=(0101)$_2$ and circled C=(1100)$_2$ which are adjacent to each other, they differ by 1 bit only about lower two bits thereof. Similarly, as for square-inscribed 5=(0101)$_2$ and triangle-inscribed 3=(0011)$_2$ which are adjacent to each other, they also differ by 1 bit only about lower two bits thereof.

By thus arranging the symbols, the Euclidean distance and the Hamming distance concerning the uncoded bits are same in terms of relative magnitude relation. Moreover, the Euclidean distance and the Hamming distance concerning the coded bits to be Viterbi decoded are also same in terms of relative magnitude relation.

Next, operation for the decoding circuit will be described hereinbelow.

Figure 7:
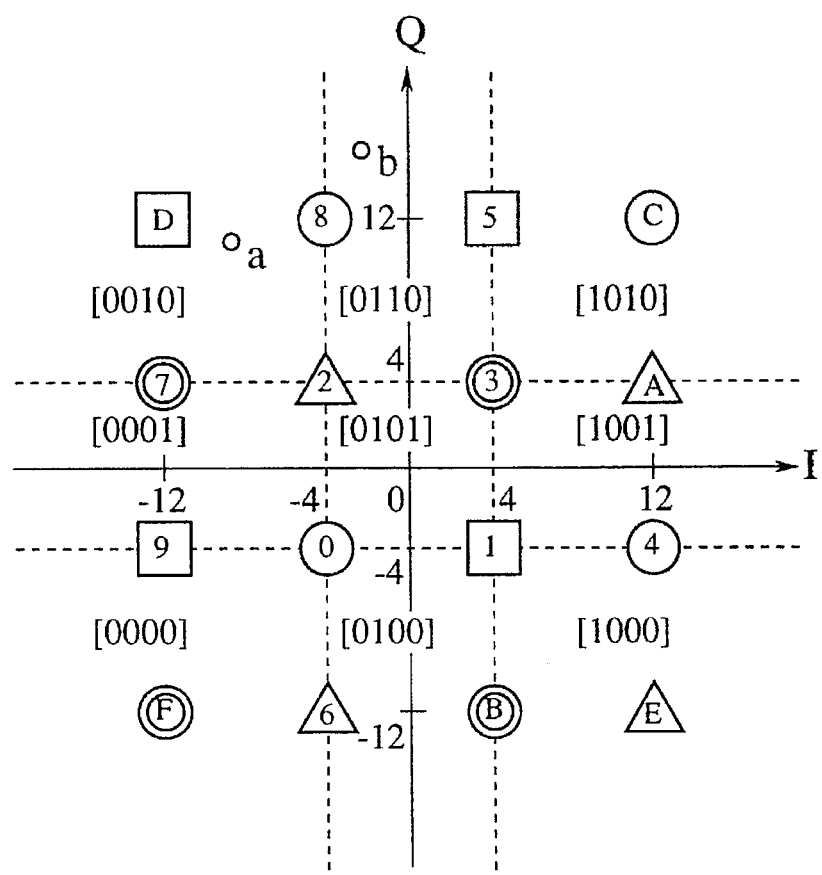
FIG. 7 shows relationship between the output of the region determining portion 13 and the received symbols.

FIG. 7 shows relationship between the output of the region determining portion 13 and the received symbols. In a case of 9-value soft decision shown in FIG. 7, dotted lines indicate boundary between each region, and there is a total of nine regions, and a value of 4 bits are assigned to each region. These 4-bit value is corresponded to 9-ways of representative groups in one-to-one correspondence basis. For example, when the received symbol is a, the output of the region determining portion 13 is (0010) which corresponds to a set (group) consisting of square-inscribed D, circled 8, double-circled 7 and triangle-inscribed 2.

Referring still to FIG. 7, when the received symbol is located at b, the output of the region determining portion 13 is (0110), which corresponds to a set (group) consisting of circled 8, square-inscribed 5, triangle-inscribed 2 and double-circled 3. Now, it is to be noted that when the received symbol lies on a boundary, an error correcting capability therefor is not affected even if the symbol is contained in either regions located around the boundary.

There are nine different ways of expressing sets (groups) of the representative symbols, in the example shown in FIG. 7. Therefore, 4 bits will be sufficient. Thus, in order to obtain a region information as to where the received symbol lies, the received symbol is associated with the representative symbol, so that where the received symbols belongs to is determined in the region determining portion 13.

In the region determining portion 13, which representative symbol the received symbol corresponds to in the one-to-one correspondence basis, is judged, so that the region determining bit of 4 bits is output as the region information. Thereafter, by the T-stage shift register 15 serving as delaying means, the output is delayed for a duration equivalent to the time consumed for decoding processing in the Viterbi decoder 11, and is then fed to the uncoded bit decoder 17. In the uncoded bit decoder 17, the 4-bit output from the T-stage shift register 15 and the coded bit of 2 bits from the Viterbi decoder 11 are decoded so as to output uncoded bit of 2 bits. Then, there are only nine representative sets, and each set is expressed by 4 bits. Thereby, when the lower two bits are determined, the upper two bits are determined uniquely.

Figure 5:
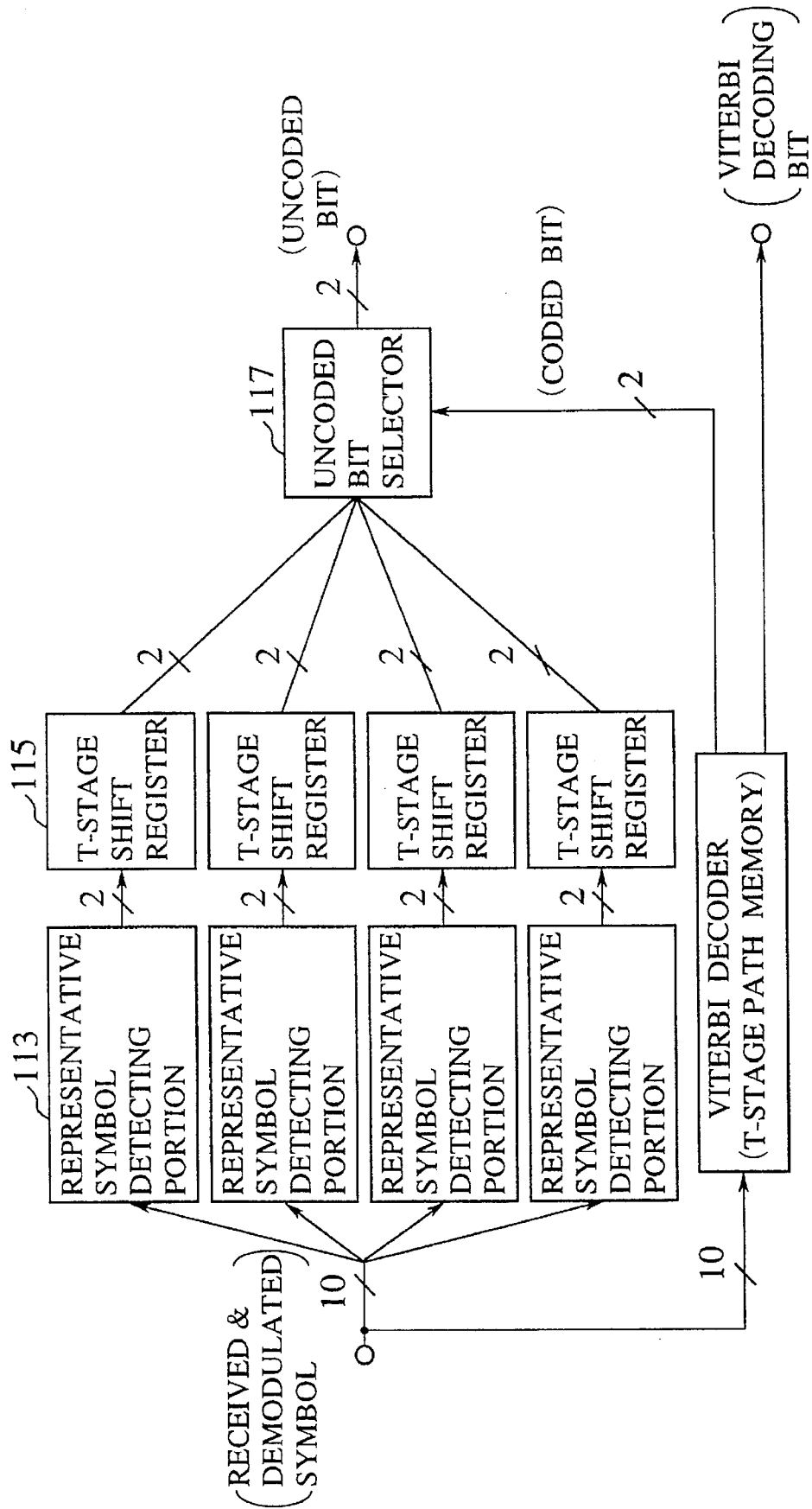
FIG. 5 illustrates a typical uncoded-bit decoding system according to the conventional practice.

Next, let us demonstrate a significant result achieved by the present invention. The uncoded bit decoding apparatus including the region determining portion 13, the T-stage shift register 15 and the uncoded bit decoder 17 according to the present invention shown in FIG. 7 is compared with the conventional uncoded bit decoder including the representative symbol detecting portion 113, the T-stage shift register 115 and uncoded bit selector 117 shown in FIG. 5, in terms of the number of transistors required therefor. As a result, the total number of approximately 22 k transistors under the conventional practice was reduced to the total number of approximately 11 k transistors, thus reducing the scale of the decoder over the conventional one by half.

Figure 8:
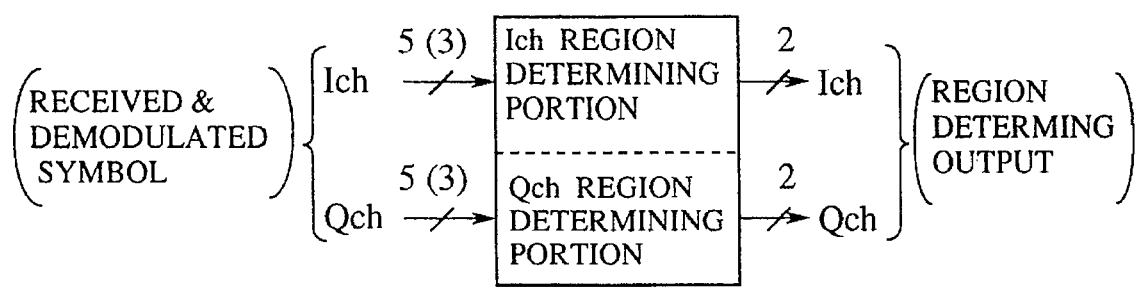
FIG. 8 show configuration of the region determining means when I-channel components and Q-channel components are separately and independently determined.

In an example of the soft decision where I-channel components and Q-channel components are separately and independently determined as illustrated in FIG. 8, relation between input and output for each channel is as shown in FIG. 9. Evident from FIG. 9, there is no need to decode all of 5 bits for each channel, it suffices to decode upper 3 bits only. Therefore, when constituted by the ROM, the region determining portion can be achieved by two ROMs whose bit is $2^3 \times 2 = 16$ bits.

SECOND EMBODIMENT

Figure 10:
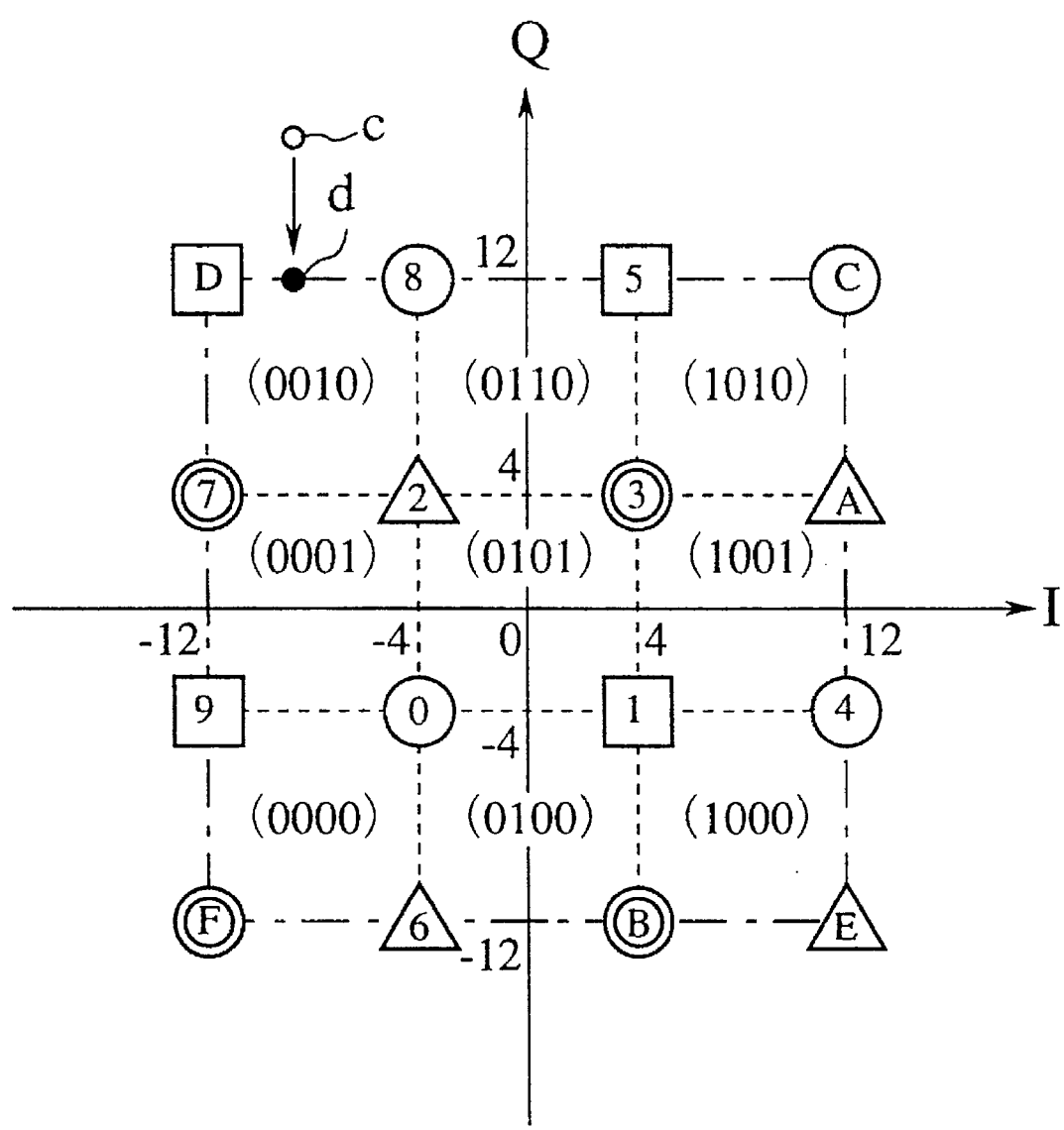
FIG. 10 shows an output example of region determining means where the branch metric is obtained after amplitude limitation is applied to the received symbol.

The second embodiment according to the present invention will be described with reference to FIG. 10. FIG. 10 shows an output example of region determining means where the branch metric is obtained after amplitude limitation is applied to the received symbol.

Referring to FIG. 10, even the branch metric is obtained after the amplitude limitation or limiter is applied to the received symbol, no deterioration of the error-correcting capability results therefrom. This is because the order of the Euclidean distance for each representative symbol remains intact even if the amplitude limitation is carried out. For example, referring to FIG. 10, the representative symbol which is closest to the received symbol c is square-inscribed D. The distance between the received symbol c becomes larger with circled 8, double-circled 7 and triangle-inscribed 2, in this order. Even with the received symbol d applied by the amplitude limitation, this order remains intact.

Accordingly, when the region determination is carried out on the received symbol d to which the amplitude limitation is applied, further efficient circuit configuration can be achieved, in other words, further scaled-down circuit configuration is realized thereby.

FIG. 11 shows relation of then input and output of the region determining means for each channel. Referring to FIG. 11, since the inputs are of seven types consisting of "011", "010", "001", "000", "111", "110" and "101", so that decoding is performed on these 7 kinds alone.

Figure 13:
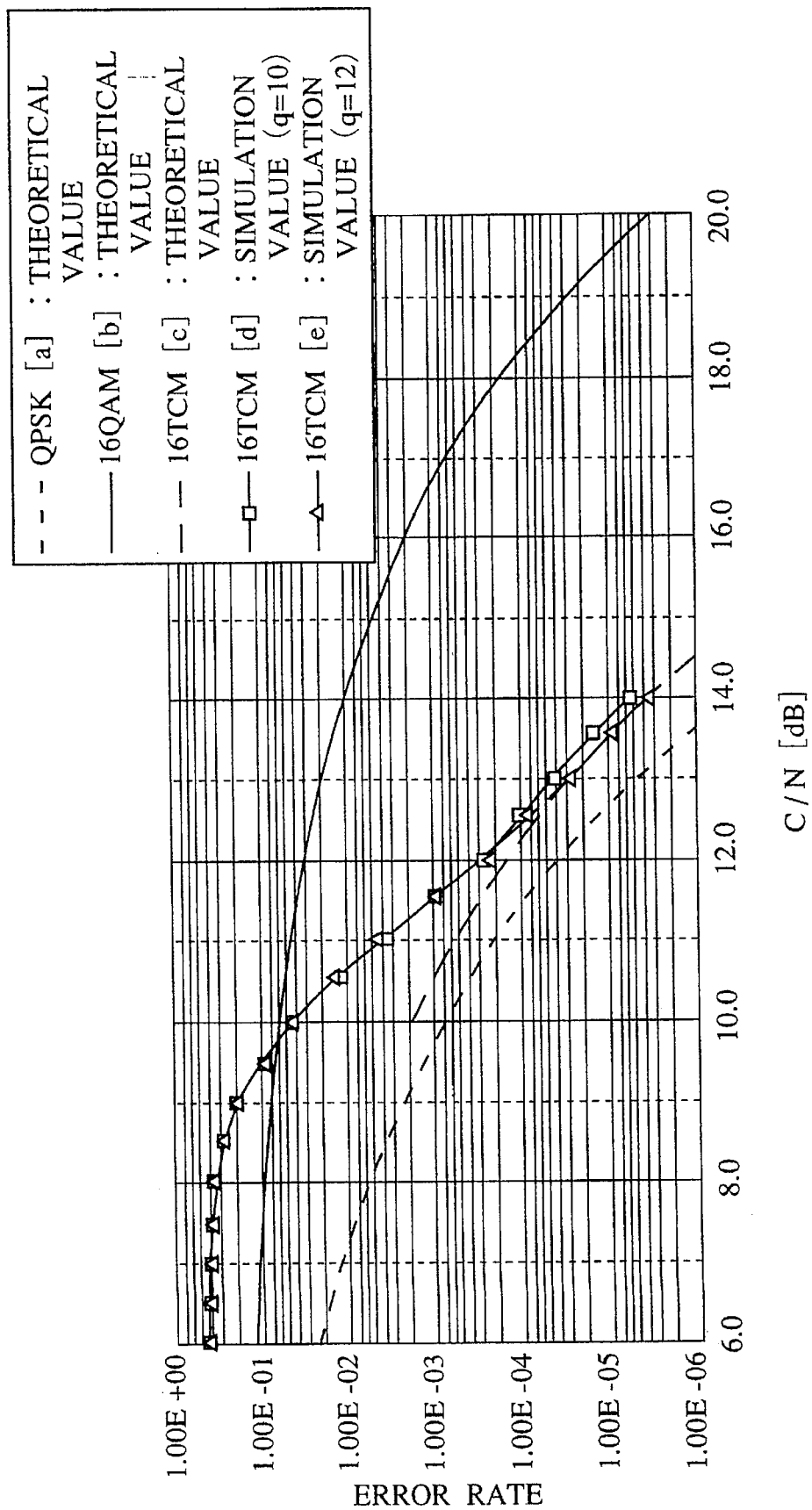
FIG. 13 is a graph showing data (BER vs. C/N) where the amplitude limitation and region determination are applied in accordance with the second embodiment.

FIG. 13 is a graph showing data (BER vs. C/N) where the amplitude limitation and region determination are applied utilizing the signal space mapping scheme according to the second embodiment. In FIG. 13, graph [a] indicates the BER (bit error rate) characteristic of QPSK (quadrature phase shift keying) in the uncoding, graph [b] indicates the BER characteristic of 16 QAM (quadrature amplitude modulation), and graph [c] indicates the BER of 16 TCM (trellis-coded modulation) and an asymptotic lower limit (theoretical value) for its characteristic calculated by the Ungerboeck's publication. Graph [d] indicates the BER characteristic obtained by simulation where the bit number of the soft-decision value for the received symbol is 10 bit (q=10, where q stands for quantization). Graph [e] indicates BER characteristic with q being set to 12. In this case, I-channel and Q-channel are such that the input is 6 bit and the output is 2 bit. As described in the previous embodiments, all of the 6 bits need not be decoded, and the upper three bits for I channel and Q channel, respectively, suffice for achieving the decoding operation, in other words, the upper 3 bits can be determined with accuracy of 6 bits. Moreover, the region determination can be further accurately performed with q=12 so as to obtain better characteristics.

Moreover, the bit number of the above-described region determination output is preferable such that it is a minimum bit number while not less than $\log_2 J$ where J indicates the number of groups (sets) for the symbols specified by the received symbols. For example, in the case shown in FIG. 7, J=9, and since it holds that $3 < \log_2 J < 4$, the bits of the region determination output are set to 4 in the above embodiments.

The bit number of the region determination output may be any number greater than or equal to four such that it is not less than $\log_2 J$.

For example, when the bit number is set to 5, there can be obtained the region determination output corresponded to each region where 5 bits are employed by adding "0" or "1" to the 4 bits shown in FIG. 6. In this case, the circuit scale of the uncoded bit decoding portion will be 5/4 times that of the first embodiment, thus requiring approximately 14–15 k transistors. However, the circuit scale would be still smaller than that of the conventional practice.

Accordingly, by employing the present invention, the circuit scale for the uncoded bit decoding circuit in the trellis decoder is significantly reduced without deteriorating error-correcting capability.

MODIFICATIONS

With regard to the above second embodiment, further detailed description and modification therefor will be explained hereinbelow.

Figure 14:
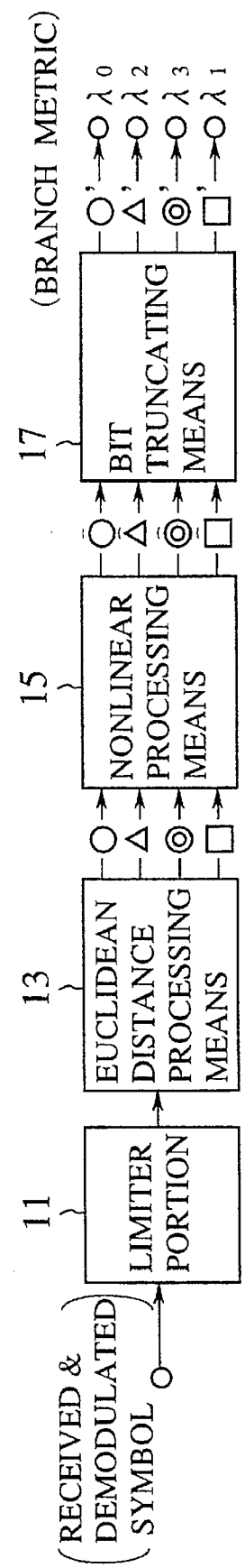
FIG. 14 is a block diagram showing the branch metric calculating circuit.

FIG. 14 is a block diagram showing the branch metric calculating circuit. Referring to FIG. 14, the branch metric calculating circuit comprises: a limiter portion or limiting circuit 11, an Euclidean distance processing means 13, a nonlinear processing means 15 and a bit truncating means 17 connected in series, in this order.

Figure 15:
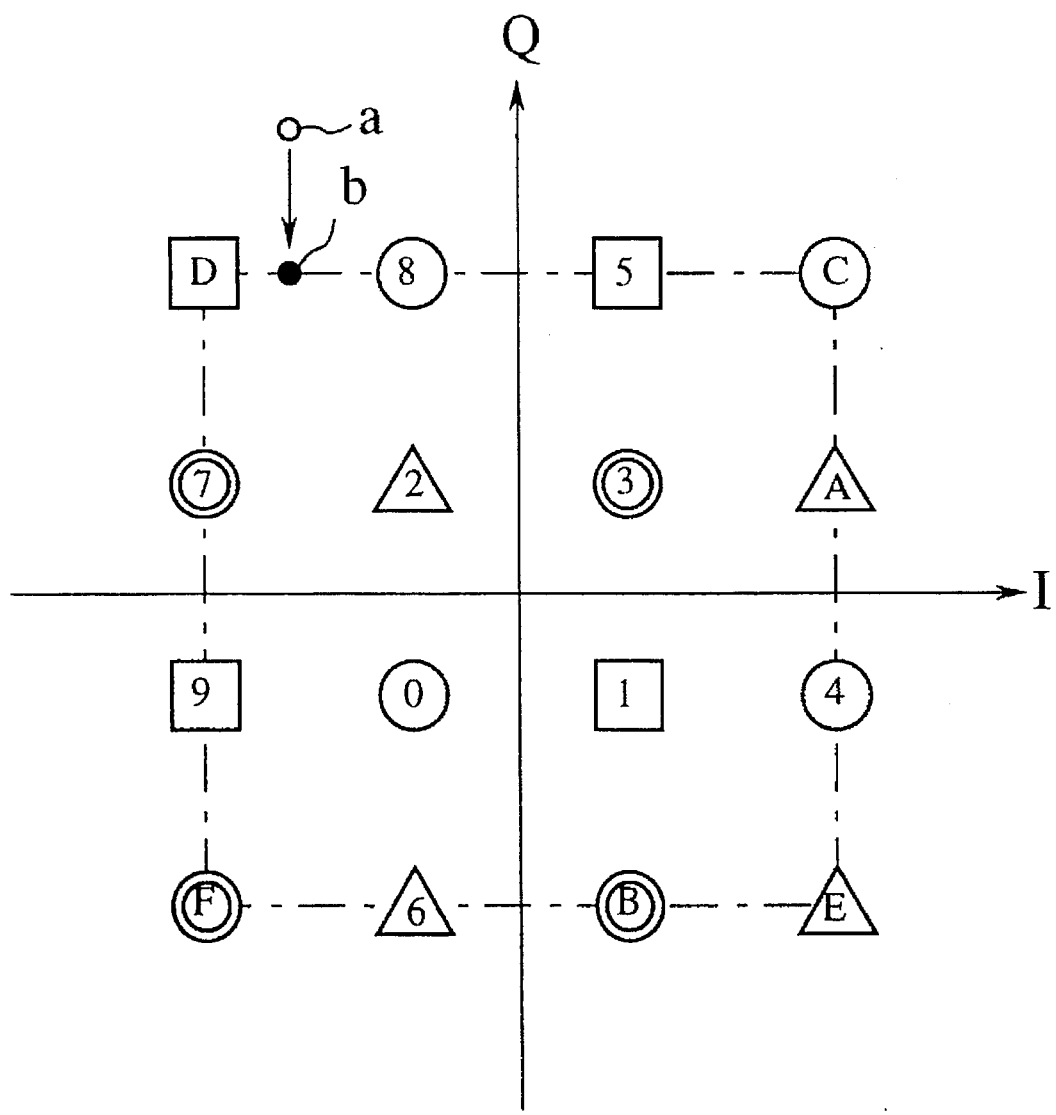
FIG. 15 is a signal space mapping example for explaining a range of the amplitude limitation for the received symbols.

FIG. 15 is a signal space mapping example for explaining a range of the amplitude limitation for the received symbols. Let us again explain the gist of the second embodiment. The error-correcting capability is not deteriorated in this case, shown in FIG. 15, where the branch metric is obtained after the amplitude limitation is applied thereto. This is because the order of the Euclidean distance against each representative symbol remains intact even after the amplitude limitation is applied. For example, referring to FIG. 15, the closest representative symbol to the received symbol a is the square-inscribed D, and from the second closed one on are the circled 8, the double-circled 7 and triangle-inscribed 2, in this order. It is to be noted that the above relation (the order of the Euclidean distance) remains the same with the symbol b to which the amplitude limitation is applied.

As shown in FIG. 16, the square of the Euclidean distance is calculated only within a region enclosed by the group of four representative symbols. FIG. 16 illustrates an example showing the square of the Euclidean distance with the representative symbol situated in lower left position marked with STARTING POINT in the nine-value soft decision. For example, referring to FIG. 16, when the received symbol lies in position c, the square of the Euclidean distance from the lower left representative symbol (STARTING POINT) is $5^2+5^2=50$. In a similar manner, when the received symbol lies in position d, the square of the Euclidean distance from the STARTING POINT is $7^2+0^2=49$. Similarly, when the received symbol lies in position e, the square of the Euclidean distance therefrom is $8^2+8^2=128$.

As from FIG. 16, the range of the square values of the Euclidean distance is 0 through 128, and 8 bits are required to express the value. On the other hand, in the case shown in FIG. 16, the event that its MSB (most significant bit) becomes 1 occurs only when the received symbol lies in the position c. Thus, it is not efficient that the 1 bit of MSB is used in this event alone. Therefore, in this very event that the square of the Euclidean distance is 128 with c, the value of 128 is changed to 127 by the nonlinear processing means 15. Thereby, all of the square values of the Euclidean distance can be expressed by 7 bits.

Modification No. 1

The efficiency of the path metric calculation is furthermore improved when the bits are truncated by the bit truncating means.

Figure 20:
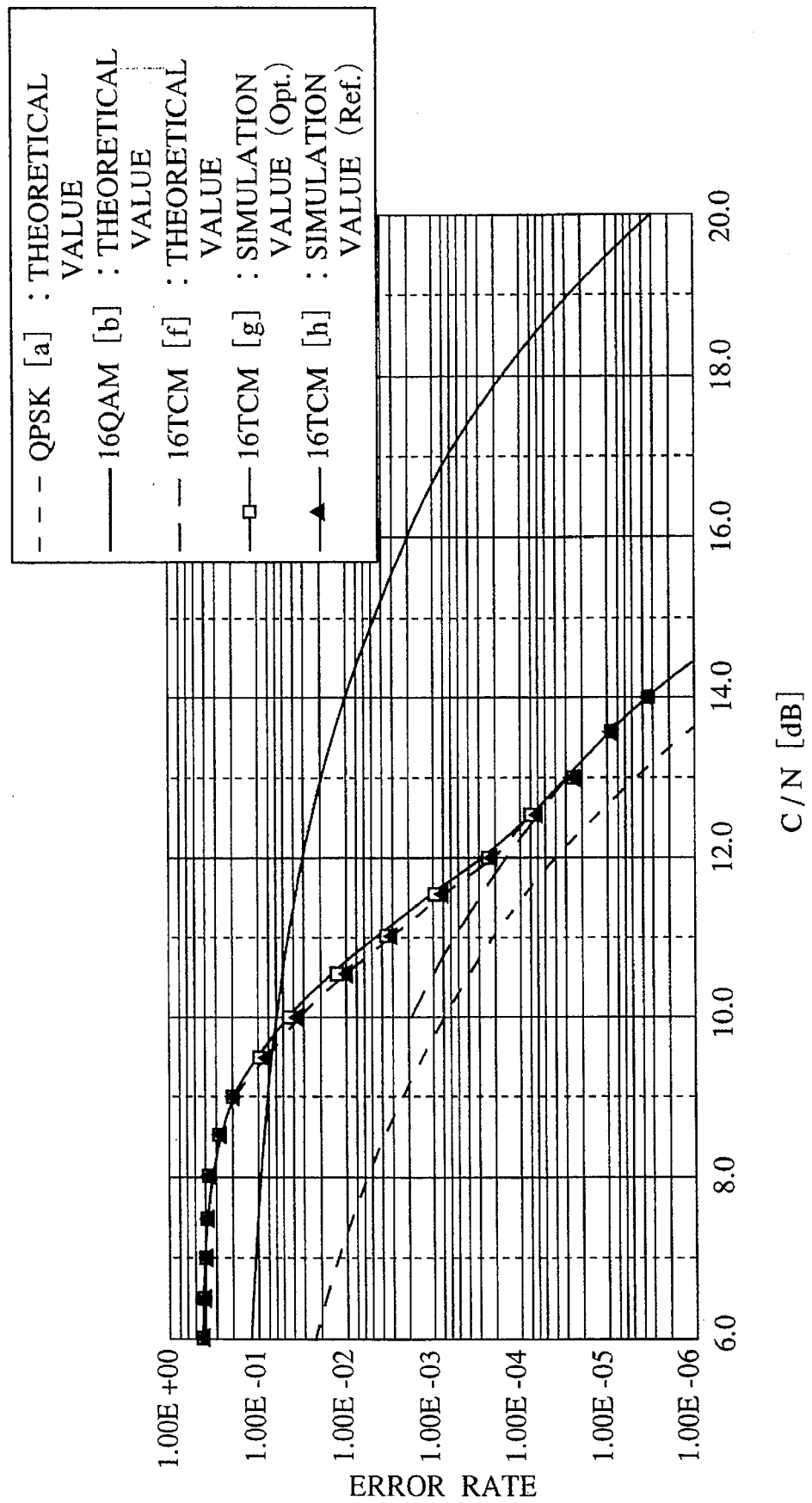
FIG. 20 is a graph showing the BER characteristics when the amplitude limitation , nonlinear processing and bit truncation (Bs=3) are applied.

FIG. 20 is a graph showing the BER characteristics when the amplitude limitation, nonlinear processing and bit truncation (Bs=3) are applied and when those are not applied, utilizing the signal space mapping shown in FIG. 12.

According to simulation-experimental result of graph [g] in FIG. 20 where up to the upper 3 bits are truncated, there is caused little deterioration in decoding. In FIG. 18, decimal expressed is each branch metric corresponding to constellation shown in FIG. 16. FIG. 18 illustrates a case where the nonlinear processing is performed, while FIG. 19 illustrate a case where the nonlinear processing is not performed. If the bit truncation is carried out without adopting the non-linear processing, there will be required 4 bits as shown in FIG. 19, in order not to cause the decoding deterioration.

In this example, an expression bit number, that is, a quantization bit number of the received symbol is set to 12 bits. Referring to FIG. 20, it is found that the effect of amplitude limitation process, nonlinear processing and bit truncating processing can be negligible, so that the present invention is found to be very effective in reducing a circuit scale therefor.

Graph [f] indicates the BER of 16 TCM (trellis-coded modulation) and an asymptotic lower limit (theoretical value) for its characteristic calculated by the Ungerboeck's publication.

Modification No. 2

It shall be appreciated that the configuration of the non-linear processing means 15 and the bit truncating means 17 shown in FIG. 14 may be switched, in other words, the position and connection of the nonlinear processing means 15 shown in FIG. 14 may be replaced by the bit truncating means 17, while the means 17 is replaced by the means 15. For example, when the upper right "8" among branch metrics shown in FIG. 19 is forcibly changed to "7", thus being identical to the branch metrics shown in FIG. 18 and showing that the 3 bit expression is enough.

As described above, in order to facillitate calculation of the Euclidean distance, the limiting operation is performed which manipulates to move the received symbol within the predetermined region or by limiting the amplitude of the received symbol (if the symbol is received outside the predetermined region). This technique is very useful in a rectangular- or cross-type modulation mode such as 16 QAM and 32 QAM. Moreover, the bit number of the branch metrics is reduced by applying the nonlinear processing (limiter processing) to the output of the Euclidean distance processing means to the degree that the decoding deterioration will not occur. Thereby, a burden which will be placed on the branch metric calculation thereafter will be alleviated. Moreover, the scale and size of the branch metric calculating circuit can be reduced.

Accordingly, by employing the second embodiment and the modification therefor according to the present invention, the bit number of the branch metrics is reduced and the circuit scale can be minimized.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A digital data processing apparatus in which a predetermined number of bits of a portion of information symbols constituted by a plurality of bits in a transmitting side, is convolutional-coded so as to produce a plurality of coded bits, whereas a number of bits of a remaining portion of the information symbols are uncoded bits, a combination of the coded bits and the uncoded bits is trellis-coded, and the trellis-coded bits are decoded in a receiving side, so that the uncoded bits are decoded utilizing the coded bits that are decoded in a convolutional decoding portion, the apparatus comprising:

region determining means for inputting a received symbol so as to generate at least one uncoded bit and producing regional information corresponding to a group of symbols specified by the received symbol;

delaying means for delaying the regional information output from the region determining means for as long as the received symbol is maximum-likelihood-decoded by a maximum-likelihood decoding means; and decoding means for inputting an output from the delaying means and a coded bit that is decoded by the maximum-likelihood decoding means, and for outputting the uncoded bits as a result thereof, wherein the region determining means includes means for determining an optimal bit number in such a manner that the optimal bit number is a minimum bit number while not less than $\log_2 J$, where J indicates a number of groups for the information symbols specified by the received symbol.

2. The apparatus of claim 1, wherein a T-stage shift register serves as the delaying means.

3. The apparatus of claim 1, wherein the region determining means includes limiter means for limiting amplitude on the received symbol so as to obtain the regional information.

4. The apparatus of claim 3, wherein the region determining means further includes means for determining an optimal bit number in such a manner that the optimal bit number is a minimum bit number while not less than $\log_2 J$, where J indicates a number of groups for the information symbols specified by the received symbol.

5. An uncoded bit decoding device in which a predetermined number of bits of a portion of information symbols constituted by a plurality of bits in a transmitting side, is Viterbi-coded so as to produce at least one coded bit, whereas a number of bits of a remaining portion of the information symbols are uncoded bits, a combination of the at least one coded bit and the uncoded bits is trellis-coded, and the trellis-coded bits are decoded in a receiving side, so that the uncoded bits are decoded utilizing the at least one coded bit that is decoded in a Viterbi decoding portion, the device comprising:

region determining means for determining in which one of a plurality of groups each having four adjacent symbols, the received symbol is located and outputting a signal indicative of the one group;

delaying means for delaying an output from the region determining means for as long as the at least one coded bit is decoded by the Viterbi decoding portion; and decoding means for inputting and decoding an output from the delaying means and the at least one coded bit that is decoded by the Viterbi decoding means, and for outputting the uncoded bits as a result thereof.

6. The apparatus of claim 5, wherein a T-stage shift register serves as the delaying means.

7. The apparatus of claim 6, wherein the region determining means determines the one group based on the one group having the least Euclidean distance with respect to the received symbol of all of the groups.

8. The apparatus of claim 5, wherein the region determining means includes limiter means for limiting amplitude on the received symbol so that the received symbol is moved within a predetermined region in the event that the received symbol lies outside the predetermined region.

9. The apparatus of claim 5, wherein the region determining means includes means for determining an optimal bit number in such a manner that the optimal bit number is a minimum bit number while not less than $\log_2 J$, where J indicates the number of groups for the symbols specified by the received symbol.

10. The apparatus of claim 8, wherein the region determining means further includes means for determining an optimal bit number in such a manner that the optimal bit number is a minimum bit number while not less than $\log_2 J$, where J indicates the number of groups for the symbols specified by the received symbol.

11. A branch metric processing apparatus where a predetermined number of bits of a portion of information symbols constituted by a plurality of bits in a transmitting side, is convolutional-coded so as to produce a plurality of coded bits, whereas a number of bits of a remaining portion of the information symbols are uncoded bits, a combination of the coded bits and the uncoded bits is trellis-coded, and the trellis-coded bits are decoded in a receiving side, so that the uncoded bits are decoded in accordance with a received symbol obtained after soft-decision, utilizing the coded bits that are decoded in a Viterbi decoding portion, the apparatus comprising:

limiter means for performing an amplitude limitation on the received symbol obtained by the soft-decision;

distance calculating means for producing a branch metric using an output of the Viterbi decoding portion, by calculating a square of Euclidean distance on data obtained from the limiter means in the form of a first number of bits; and approximation means for replacing the first number of bits by a second number of bits fewer than the first number of bits.

12. The apparatus of claim 11, further comprising:

nonlinear processing means, connected to the distance calculating means, for performing a nonlinear processing in the event that an output value of the distance calculating means is greater than a predetermined value, so that the output value is limited to within the predetermined value.

13. The apparatus of claim 11, further comprising:

bit truncating means, connected to the distance calculating means, for truncating the bit of an output value from the distance calculating means.

14. The apparatus of claim 12, further comprising:

bit truncating means, connected to the nonlinear processing means, for truncating the bit of an output value from the nonlinear processing means.

15. The apparatus of claim 13, further comprising:

nonlinear processing means, connected to the bit truncating means, for performing a nonlinear processing in the event that an output value of the bit truncating means is greater than a predetermined value, so that the output value is limited to within the predetermined value.

16. The apparatus of claim 12, wherein the least Euclidean distance to the received symbol is calculated with respect to a center point equidistant to the respective four adjacent symbols of the one group.

17. The apparatus of claim 16, wherein the replacement by said approximation means is performed in a nonlinear processing manner.

18. The apparatus of claim 16, wherein said approximation means rounds down the first number of bits to the second number of bits when the most significant bit of the first number of bits is logic 1.

19. The apparatus of claim 18, wherein the first number of bits is 8 while the second number of bits is 7.

* * * * *